US009564515B2

(12) United States Patent
You et al.

(10) Patent No.: US 9,564,515 B2
(45) Date of Patent: Feb. 7, 2017

(54) SEMICONDUCTOR DEVICE HAVING SUPER JUNCTION STRUCTURE AND METHOD FOR MANUFACTURING THE SAME

(71) Applicant: TAIWAN SEMICONDUCTOR MANUFACTURING CO., LTD., Hsinchu (TW)

(72) Inventors: Jheng-Sheng You, Zhubei (TW); Che-Yi Lin, Hsinchu (TW); Shen-Ping Wang, Keelung (TW); Kun-Ming Huang, Taipei (TW); Lieh-Chuan Chen, Hsinchu (TW); Po-Tao Chu, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 26 days.

(21) Appl. No.: 14/444,861

(22) Filed: Jul. 28, 2014

(65) Prior Publication Data

US 2016/0027874 A1 Jan. 28, 2016

(51) Int. Cl.
*H01L 29/66* (2006.01)
*H01L 29/78* (2006.01)
(Continued)

(52) U.S. Cl.
CPC ..... *H01L 29/66712* (2013.01); *H01L 29/0634* (2013.01); *H01L 29/0878* (2013.01);
(Continued)

(58) Field of Classification Search
USPC ......... 257/E21.056, E21.418, 329, 409, 493; 438/268, 274, 276, 400, 542
See application file for complete search history.

(56) References Cited

U.S. PATENT DOCUMENTS 6,803,626 B2 * 10/2004 Sapp ................ H01L 29/0634
257/329
6,987,299 B2 * 1/2006 Disney ............... H01L 29/402
257/327
(Continued)

FOREIGN PATENT DOCUMENTS

CN 103413763 * 11/2013 ........... H01L 21/336
CN 103413763 A * 11/2013

OTHER PUBLICATIONS

Pending U.S. Appl. No. 14/141,720, filed Dec. 27, 2013.

*Primary Examiner* — Telly Green
(74) *Attorney, Agent, or Firm* — Maschoff Brennan

(57) ABSTRACT

A semiconductor device having a super junction structure includes a substrate, an epitaxial layer of a first conductivity type, a first trench, a first doped region of a second conductivity type opposite to the first conductivity type, a second trench and a second doped region of the first conductivity type. The epitaxial layer of the first conductivity type is over the substrate. The first trench is in the epitaxial layer. The first doped region of the second conductivity type is in the epitaxial layer and surrounds the first trench. The second trench is in the epitaxial layer and separated from the first trench. The second doped region of the first conductivity type is in the epitaxial layer and surrounds the second trench. The second doped region has a dopant concentration greater than a dopant concentration of the epitaxial layer. A method for manufacturing the semiconductor device is also provided.

19 Claims, 19 Drawing Sheets

(51) Int. Cl.
*H01L 29/06* (2006.01)
*H01L 29/08* (2006.01)
*H01L 29/10* (2006.01)

(52) U.S. Cl.
CPC ...... *H01L 29/7802* (2013.01); *H01L 29/0886* (2013.01); *H01L 29/1095* (2013.01)

(56) References Cited

U.S. PATENT DOCUMENTS

| | | | | |
|---|---|---|---|---|
| 7,015,104 | B1* | 3/2006 | Blanchard | H01L 21/26586 257/E21.345 |
| 7,033,891 | B2* | 4/2006 | Wilson | H01L 29/7835 257/329 |
| 7,075,149 | B2* | 7/2006 | Sato | H01L 29/0634 257/335 |
| 7,332,788 | B2 | 2/2008 | Ahlers et al. | |
| 7,381,603 | B2* | 6/2008 | Hossain | H01L 29/0634 257/262 |
| 8,445,958 | B2* | 5/2013 | Tu | H01L 29/0634 257/330 |
| 8,492,221 | B2* | 7/2013 | Lin | H01L 29/0653 257/E21.337 |
| 8,569,150 | B2 | 10/2013 | Willmeroth et al. | |
| 8,642,427 | B1* | 2/2014 | Sihombing | H01L 29/66712 257/329 |
| 8,643,089 | B2* | 2/2014 | Lee | H01L 29/66712 257/329 |
| 8,921,933 | B2* | 12/2014 | Wu | H01L 29/7835 257/327 |
| 9,076,887 | B2* | 7/2015 | Lee | H01L 21/823487 |
| 2006/0134867 | A1* | 6/2006 | Blanchard | H01L 21/26586 438/270 |
| 2007/0023855 | A1* | 2/2007 | Hossain | H01L 29/0634 257/492 |
| 2011/0198689 | A1* | 8/2011 | Kim | H01L 29/0634 257/331 |
| 2011/0298042 | A1* | 12/2011 | Tu | H01L 29/0634 257/330 |
| 2012/0292689 | A1* | 11/2012 | Wu | H01L 29/7835 257/330 |
| 2013/0149822 | A1* | 6/2013 | Lee | H01L 21/823487 438/212 |
| 2013/0164915 | A1* | 6/2013 | Lin | H01L 29/0653 438/478 |
| 2013/0175607 | A1* | 7/2013 | Lee | H01L 29/66712 257/329 |
| 2014/0035029 | A1* | 2/2014 | Sihombing | H01L 29/66712 257/329 |
| 2014/0159144 | A1* | 6/2014 | Cheng | H01L 29/42368 257/330 |
| 2014/0353747 | A1* | 12/2014 | Cheng | H01L 29/66727 257/334 |
| 2015/0295024 | A1* | 10/2015 | Lee | H01L 29/0634 257/339 |

* cited by examiner

SEMICONDUCTOR DEVICE HAVING SUPER JUNCTION STRUCTURE AND METHOD FOR MANUFACTURING THE SAME

BACKGROUND

A super junction MOSFET is more attractive than a normal MOSFET for features like higher breakdown voltage and lower Rds (i.e., drain-to-source resistance). The super junction MOSFET includes p-type columns and n-type columns alternately arranged in parallel and onto a heavily doped substrate.

The p-type and n-type columns are fabricated by multi-epi process and doping processes using masks, which however results in poor uniformity, long process time and high cost.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
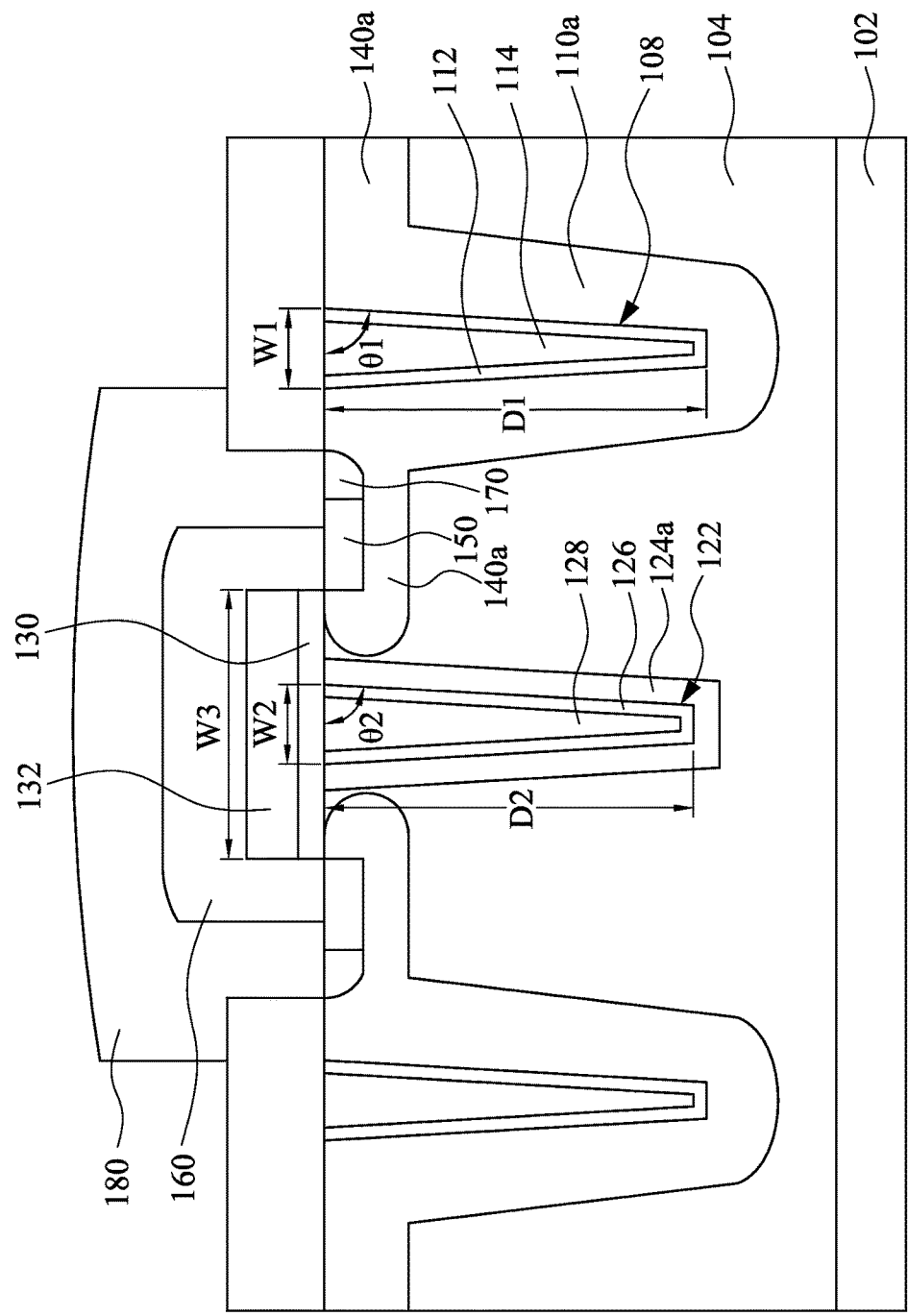
FIG. 1 is a cross-sectional view of a semiconductor device having a super junction structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As mentioned, the p-type and n-type columns of the super junction MOSFET are fabricated by multi-epi process and doping processes using masks, which results in poor uniformity, long process time and high cost. To address the above issue, a method for manufacturing a semiconductor device having a super junction structure and the semiconductor device are provided. The method of the present disclosure includes fabricating the super junction structure by forming a trench and a doped region of a conductivity type surrounding the trench, which exhibits better uniformity, less process time and lower cost compared with fabrication of a super junction structure by the multi-epi process.

In addition, the method of the present disclosure includes forming another trench and another doped region of another conductivity type there surrounding, in which the doped region has a dopant concentration greater than a dopant concentration of an epitaxial layer, so as to provide a low-resistance channel for carriers; that is, Ron (i.e., on-state resistance) can be reduced. Embodiments of the semiconductor device and the method for manufacturing the same will be sequentially described below in detail.

FIG. 1 is a cross-sectional view of a semiconductor device having a super junction structure in accordance with some embodiments. The semiconductor device includes a substrate 102, an epitaxial layer 104 of a first conductivity type, a first trench 108, a first doped region 110a of a second conductivity type, a second trench 122 and a second doped region 124a of the first conductivity type. The second conductivity type is opposite to the first conductivity type.

In some embodiments, the substrate 102 is a doped substrate of the first conductivity type. In some embodiments, the doped substrate 102 is an n-doped substrate. In some embodiments, the dopant includes arsenic, phosphorous, or another suitable n-type dopant. In some embodiments, the doped substrate 102 is a heavily doped substrate. In some embodiments, the doped substrate 102 is acted as a drain electrode. In some embodiments, the doped substrate 102 includes an elementary semiconductor including silicon or germanium in crystal, polycrystalline, or an amorphous structure; a compound semiconductor including silicon carbide, gallium arsenide, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof.

The epitaxial layer 104 of the first conductivity type is over the doped substrate 102. In some embodiments, the epitaxial layer 104 is an n-doped epitaxial (n-epi) layer. In some embodiments, the epitaxial layer 104 includes silicon, germanium or another suitable semiconductor material. In some embodiments, the epitaxial layer 104 has a thickness ranging from about 10 μm to about 80 μm. In some embodiments, a dopant concentration of the epitaxial layer 104 is sufficient to produce a resistance of the epitaxial layer 104 ranging from about 0.1 ohm-cm to about 10 ohm-cm.

The first trench 108 is in the epitaxial layer 104. The first trench is a straight walled trench or an angled trench. In the embodiment of FIG. 1, the first trench 108 is an angled trench. In some embodiments, an angle θ1 between a sidewall of the angled first trench 108 and a top surface of the epitaxial layer 104 ranges from about 85-degrees to about 89-degrees. In some embodiments, an aspect ratio W1/D1 of the first trench 108 ranges from about 1.5/50 to about 5/50. In some embodiments, the depth D1 of the first trench 108 ranges from about 8 μm to about 50 μm.

The first doped region 110a of the second conductivity type is in the epitaxial layer 104 and surrounds the first trench 108. In some embodiments, the first doped region 110a is uniformly distributed along sidewalls and across a bottom surface of the first trench 108. In some embodiments, the first doped region 110a includes p-type dopants and thus can be acted as a p-type column. In some embodiments, a dopant in the first doped region 110a includes boron, boron difluoride or another suitable p-type dopant. In some embodiments, the first doped region 110a has a dopant concentration ranging from about $10^{15}$ ions/cm$^3$ to about $10^{18}$ ions/cm$^3$.

The second trench 122 is in the epitaxial layer 104 and separated from the first trench 108. The second trench is a straight walled trench or an angled trench. In the embodiment of FIG. 1, the second trench 122 is an angled trench. In some embodiments, an angle θ2 between a sidewall of the angled second trench 122 and a top surface of the epitaxial layer 104 ranges from about 85-degrees to about 89-degrees. In some embodiments, an aspect ratio W2/D2 of the second trench 122 ranges from about 1.5/50 to about 5/50. In some embodiments, the depth D2 of the second trench 122 ranges from about 8 μm to about 50 μm.

The second doped region 124a of the first conductivity type is in the epitaxial layer 104 and surrounds the second trench 122. In some embodiments, the second doped region 124a is uniformly distributed along sidewalls and across a bottom surface of the second trench 122. In some embodiments, the second doped region 124a is in contact with the doped substrate 102. In some embodiments, the second doped region 124a includes n-type dopants and thus can be acted as an n-type column. In some embodiments, a dopant in the second doped region 124a includes phosphorus, arsenic, antimony, bismuth, selenium, or tellurium, or another suitable n-type dopant.

It is noteworthy that the second doped region 124a has a dopant concentration greater than a dopant concentration of the epitaxial layer 104, and thus to provide a low-resistance channel for carriers; that is, Ron can be reduced. In some embodiments, a ratio of the dopant concentration of the second doped region 124a to that of the epitaxial layer 104 is 10/1, and a ratio of resistance of the second doped region 124a to that of the epitaxial layer 104 is about 1/10. In some embodiments, the second doped region 124a has a dopant concentration ranging from about $10^{12}$ ions/cm$^3$ to about $10^{17}$ ions/cm$^3$. In some embodiments, the doped substrate 102 of the first conductivity type has a dopant concentration greater than the dopant concentration of the second doped region 124a.

In some embodiments, the semiconductor device further includes a fill material 128 in the second trench 122. In some embodiments, the fill material 128 includes a conductive material such as polysilicon or another suitable conductive material. In some embodiments, the fill material 128 includes a dielectric material, such as silicon dioxide, a silicon nitride or another suitable dielectric material. In some embodiments, the fill material 128 is an air gap.

In some embodiments, the semiconductor device further includes an insulating layer 126 between the fill material 128 and the second doped region 124a. In some embodiments, the insulating layer 126 includes silicon dioxide, aerogel, silicon nitride, silicon oxynitride or another suitable insulating material.

In some embodiments, the semiconductor device further includes another fill material 114 in the first trench 108. In some embodiments, the fill material 114 includes a conductive material such as polysilicon or another suitable conductive material. In some embodiments, the fill material 114 includes a dielectric material, such as silicon dioxide, a silicon nitride or another suitable dielectric material. In some embodiments, the fill material 114 is an air gap.

In some embodiments, the semiconductor device further includes another insulating layer 112 between the fill material 114 and the first doped region 110a. In some embodiments, the insulating layer 112 includes silicon dioxide, aerogel, silicon nitride, silicon oxynitride or another suitable insulating material.

In some embodiments, the semiconductor device further includes a gate electrode 132 over the epitaxial layer 104 and substantially aligned with the second trench 122. In some embodiments, the gate electrode 132 includes a conductive material such as polysilicon (poly), metal or metal alloy. In some embodiments, the gate electrode 132 has a width W3 greater than the width W2 of the second trench 122.

In some embodiments, the semiconductor device further includes a gate dielectric layer 130 between the gate electrode 132 and the epitaxial layer 104. In some embodiments, the gate dielectric layer 130 includes a dielectric material such as silicon dioxide, silicon nitride, silicon oxynitride or another suitable insulating material.

In some embodiments, the semiconductor device further includes a source region 150 of the first conductivity type in the epitaxial layer 104 and between the first trench 108 and the second doped region 124a. In some embodiments, the dopant concentration of the source region 150 is greater than the dopant concentration of the second doped region 124a. In some embodiments, the doped substrate 102 is acted as a drain electrode, and the second doped region 124a is configured to provide a low-resistance channel and thus to reduce Rdson (i.e., drain-to-source on-state resistance). In some embodiments, the source region 150 includes n-type dopants. In some embodiments, the n-type dopants include phosphorus, arsenic, antimony, bismuth, selenium, or tellurium, or another suitable n-type dopant. In some embodiments, the source region 150 has a dopant concentration ranging from about $10^{18}$ ions/cm$^3$ to about $10^{20}$ ions/cm$^3$.

In some embodiments, the semiconductor device further includes a surface doped region 140a of the second conductivity type in the epitaxial layer 104 and between the source region 150 and the second doped region 124a. In some embodiments, the surface doped region 140a is acted as a portion of a channel. In some embodiments, the surface doped region 140a is not in contact with the second doped region 124a. In some embodiments, the surface doped region is in contact with the second doped region 124a. In some embodiments, the surface doped region 140a is continuous with the first doped region 110a. In some embodiments, the surface doped region 140a extends below the gate dielectric layer 130. In some embodiments, the surface doped region 140a includes p-type dopants. In some embodiments, the p-type dopants include boron, boron difluoride or another suitable p-type dopant. In some embodiments, the surface doped region 140a has a dopant concentration ranges from about $10^{15}$ ions/cm$^3$ to about $10^{18}$ ions/cm$^3$.

In some embodiments, the semiconductor device further includes a conductive layer 180 over the gate electrode 132 and configured to electrically connect to the source region 150. In some embodiments, the conductive layer 180 includes metal, metal alloy, polysilicon or another suitable conductive material.

In some embodiments, the semiconductor device further includes an inter-layer dielectric (ILD) 160 covering the gate electrode 132 and between the gate electrode 132 and the conductive layer 180. In some embodiments, the dielectric material includes silicon oxide, silicon nitride, silicon oxynitride or another suitable dielectric material.

In some embodiments, the semiconductor device further includes a heavily doped region 170 of the second conductivity type adjacent to the source region 150. In some embodiments, the heavily doped region 170 includes p-type dopants. In some embodiments, the p-type dopant includes boron, boron difluoride or another suitable p-type dopant. In some embodiments, a dopant concentration of the heavily doped region 170 ranges from about $10^{17}$ ions/cm$^3$ to about $10^{20}$ ions/cm$^3$.

In some embodiments, a Ronsp (i.e., specific turn-on resistance) of a semiconductor device having the structure of FIG. 1, in which the depth D1 of the first trench 108 is substantially the same as the depth D2 of the second trench 122, is about 40% of Ronsp of a semiconductor device having the structure of FIG. 1 but excluding the second trench 122 and the second doped region 124a. It can be seen that the second trench 122 and second doped region 124a indeed can be used to significantly reduce Ronsp.

Figure 2:
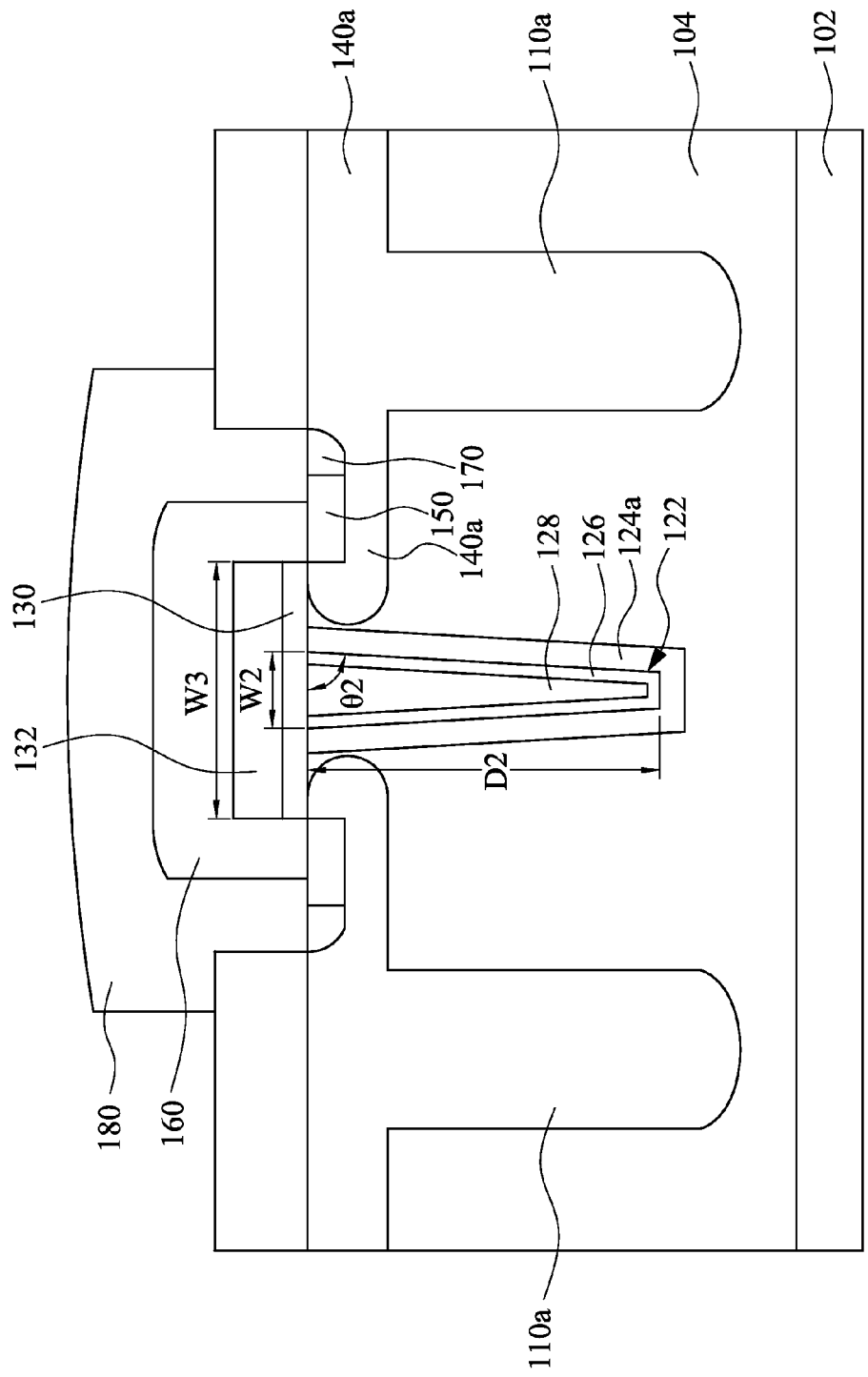
FIG. 2 is a cross-sectional view of a semiconductor device having a super junction structure in accordance with some embodiments.

FIG. 2 is a cross-sectional view of a semiconductor device having a super junction structure in accordance with some embodiments. The semiconductor device includes a substrate 102, an epitaxial layer 104 of a first conductivity type, a first doped region 110a of a second conductivity type, a second trench 122 and a second doped region 124a of the first conductivity type. The second conductivity type is opposite to the first conductivity type. The second trench 122 is separated from the first doped region 110a. The first doped region 110a of the second conductivity type of FIG. 2 is acted as a column of the second conductivity type. In some embodiments, the first doped region 110a includes p-type dopants and thus can be acted as a p-type column.

Figure 3A:
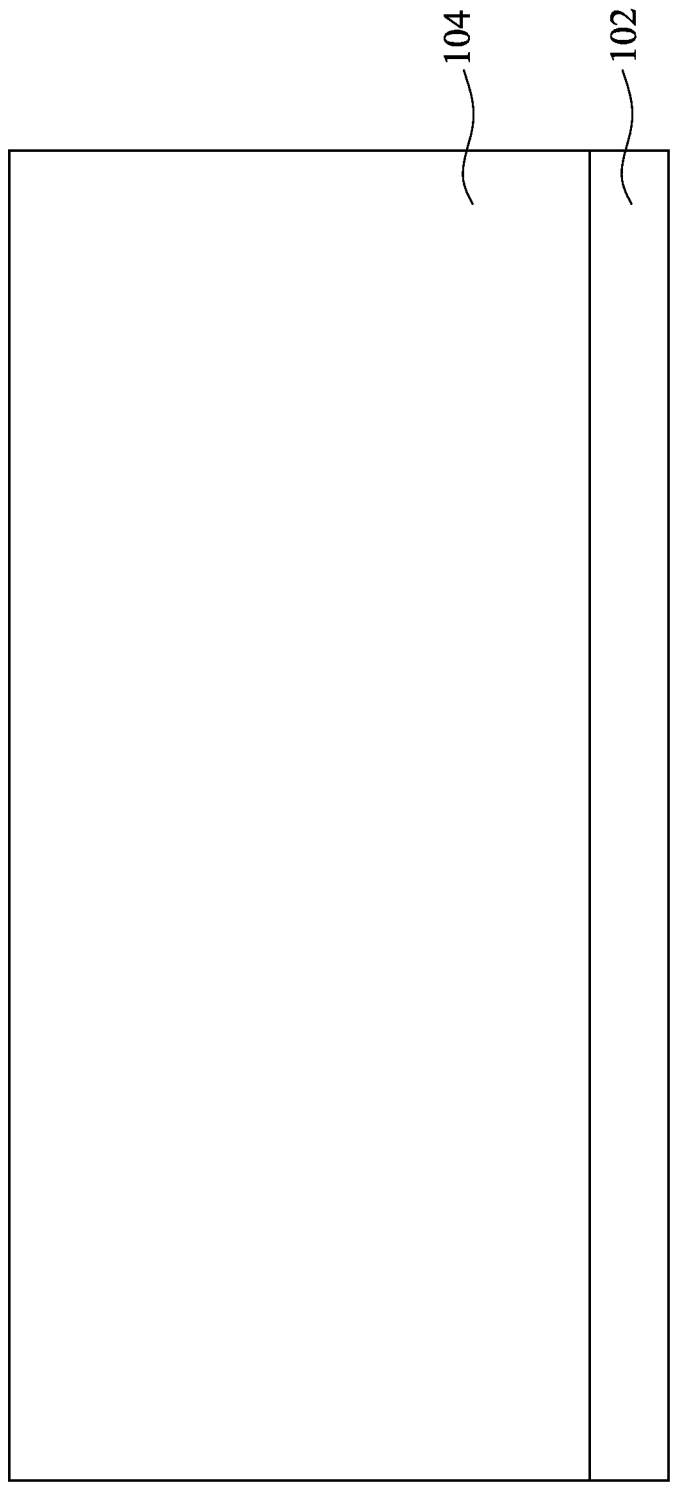
FIGS. 3A-3Q are cross-sectional views at various stages of fabricating a semiconductor device having a super junction structure in accordance with some embodiments.
Figure 3B:
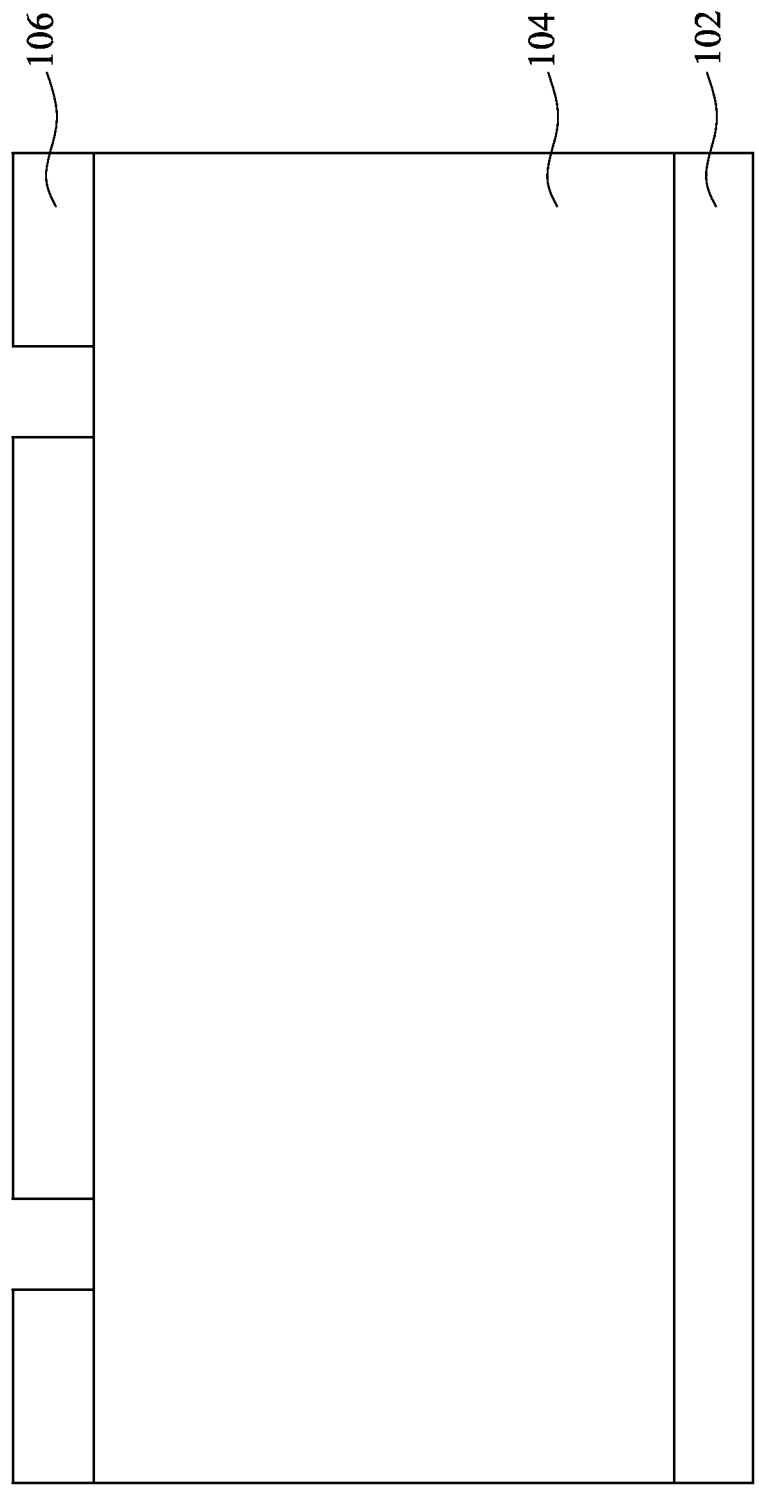
Figure 3C:
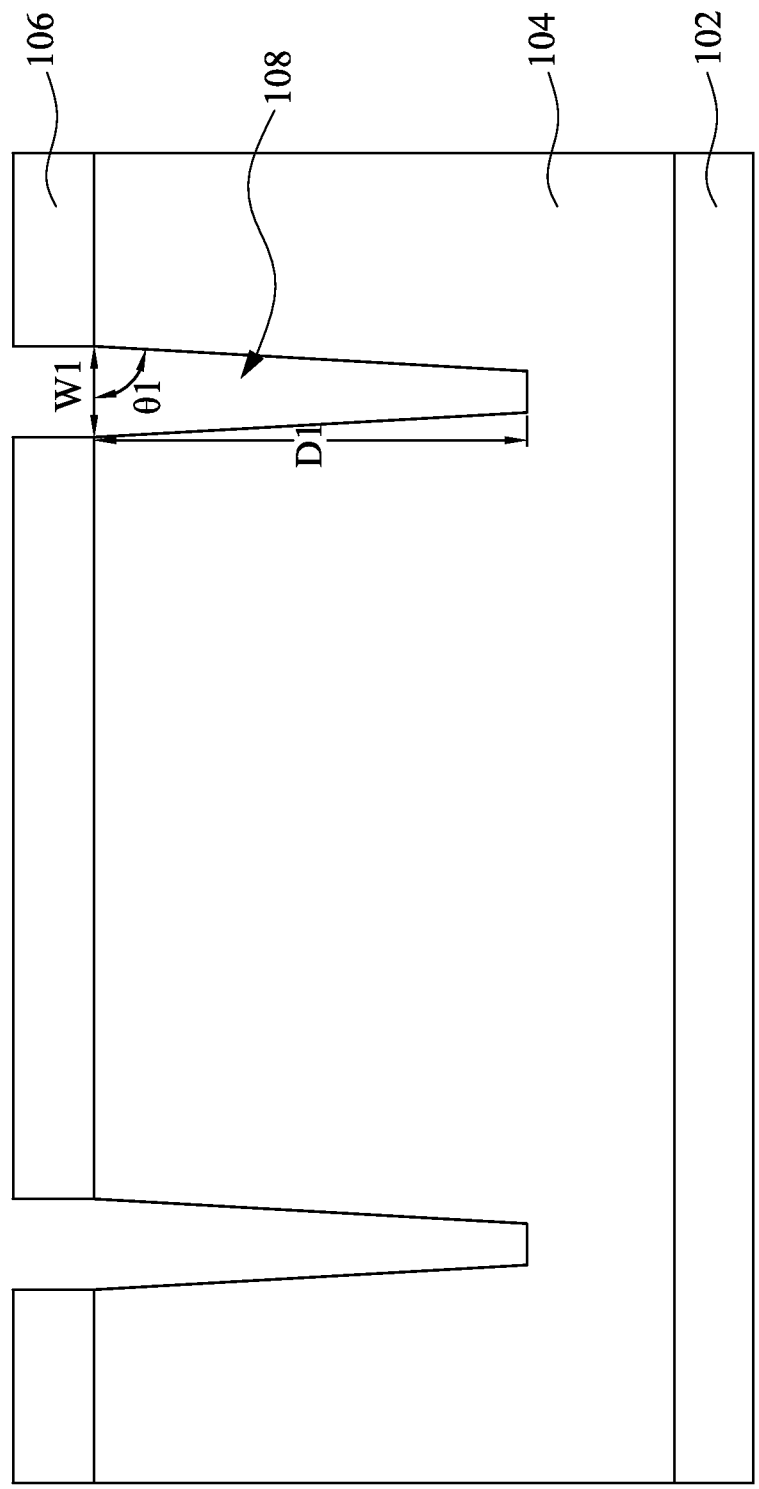
Figure 3D:
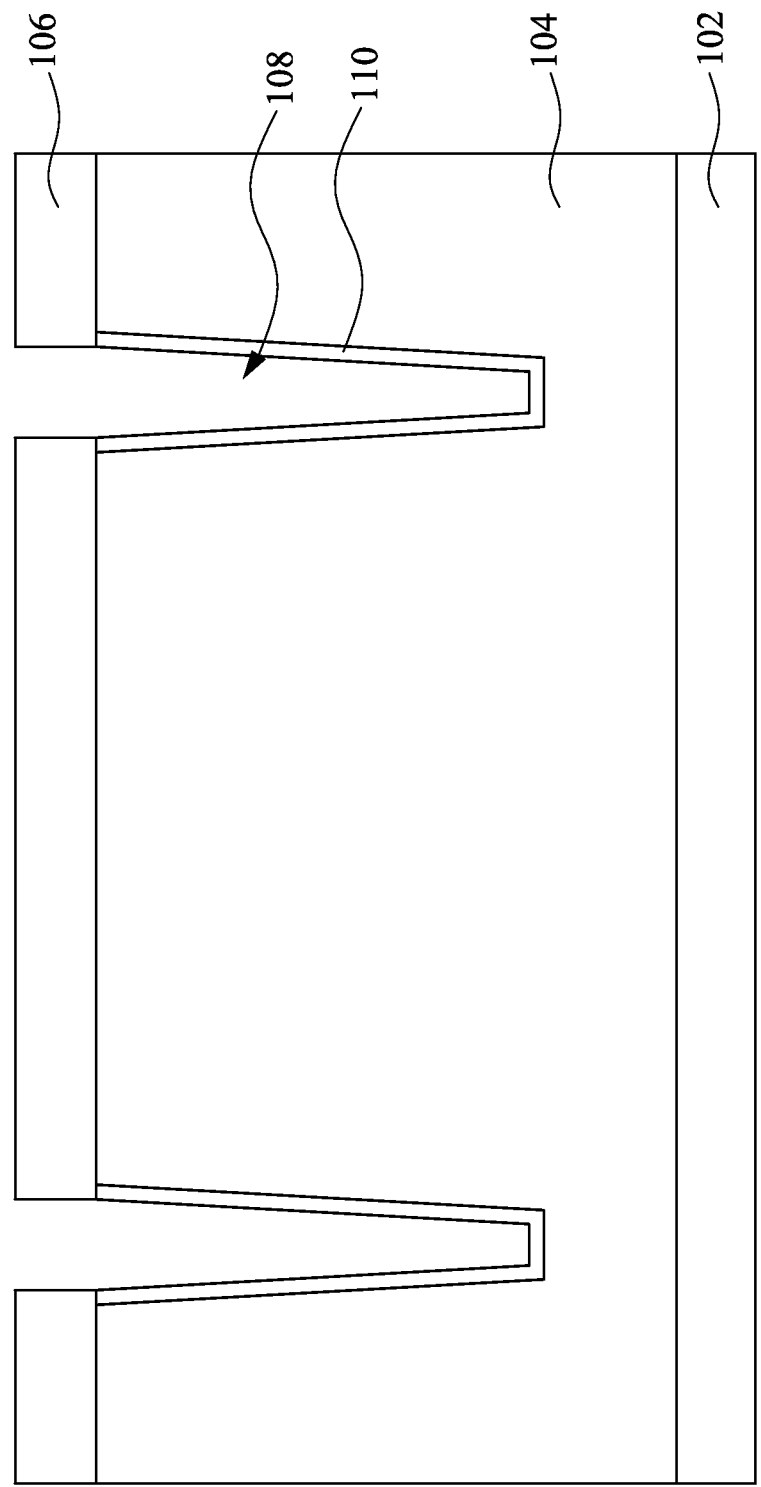
Figure 3E:
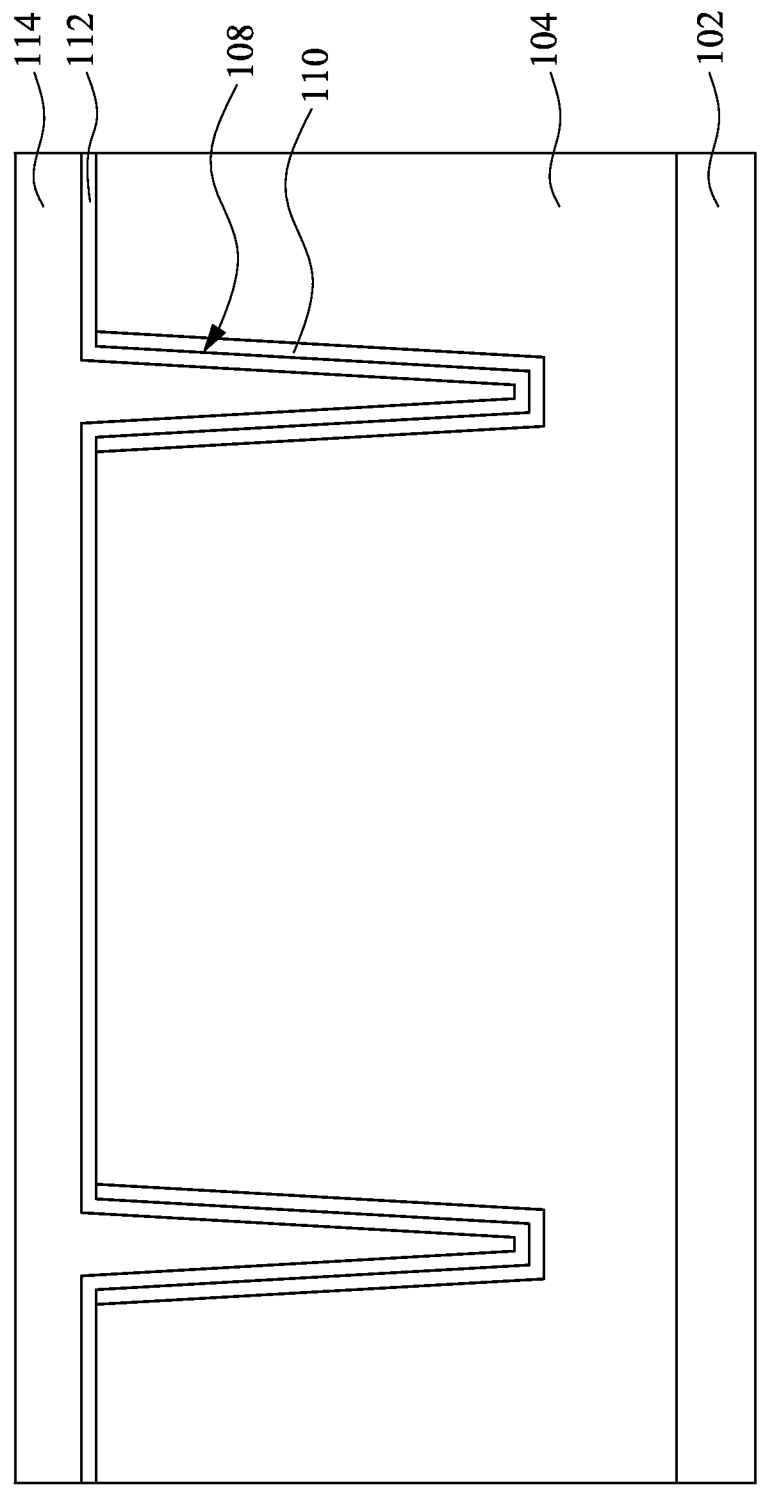
Figure 3F:
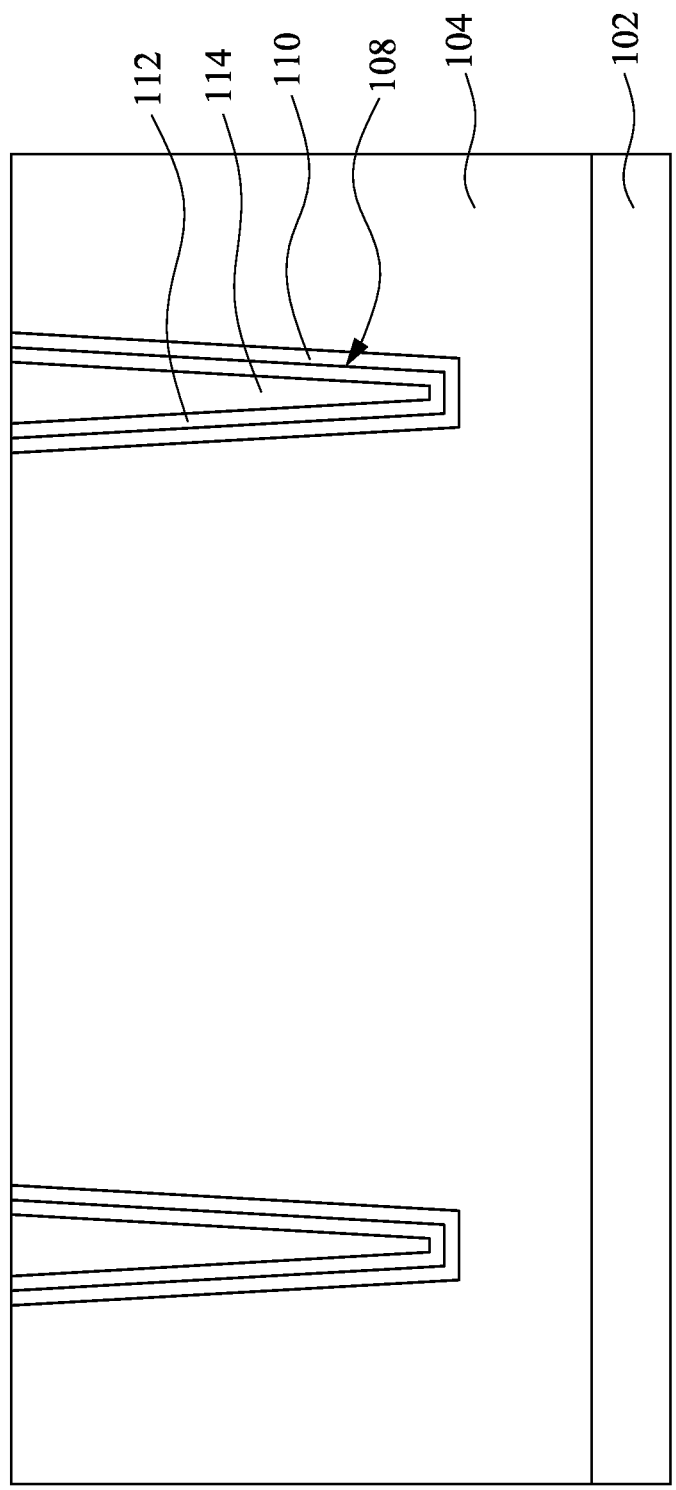
Figure 3G:
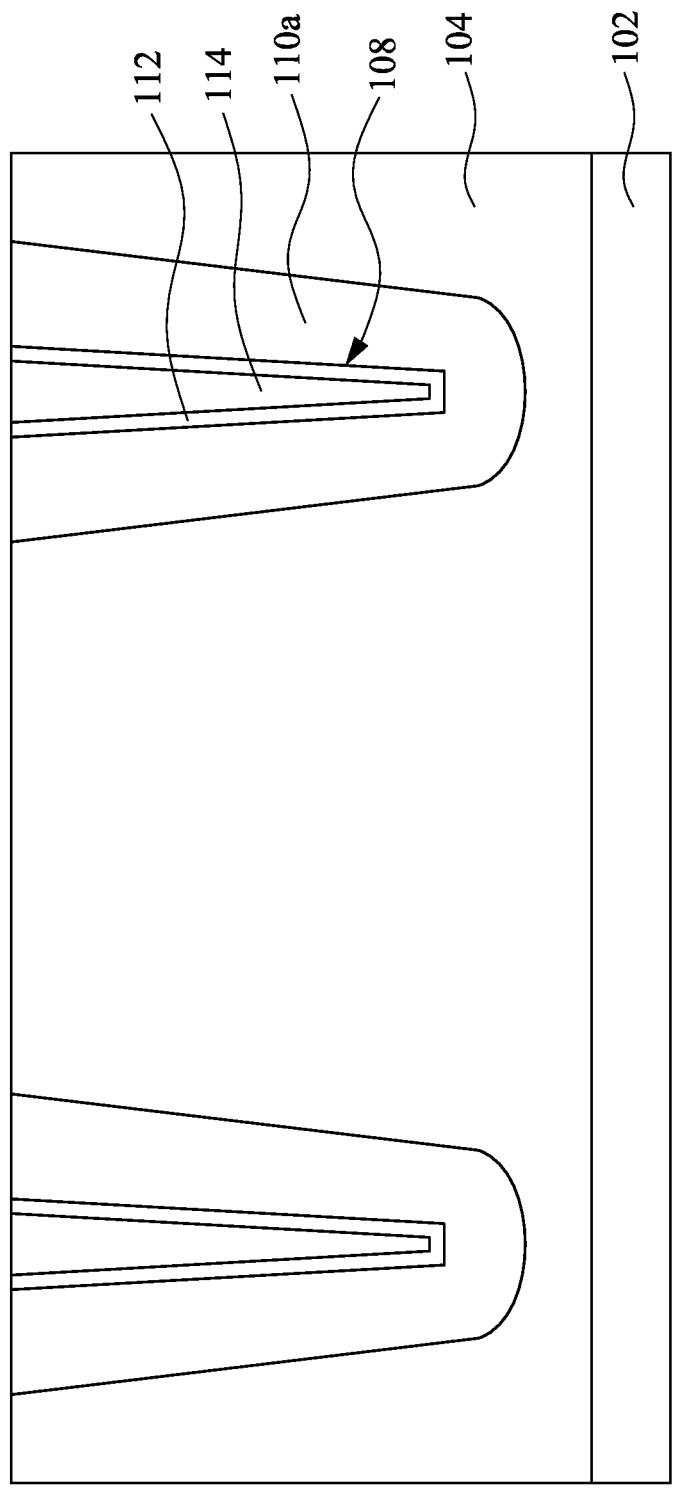
Figure 3H:
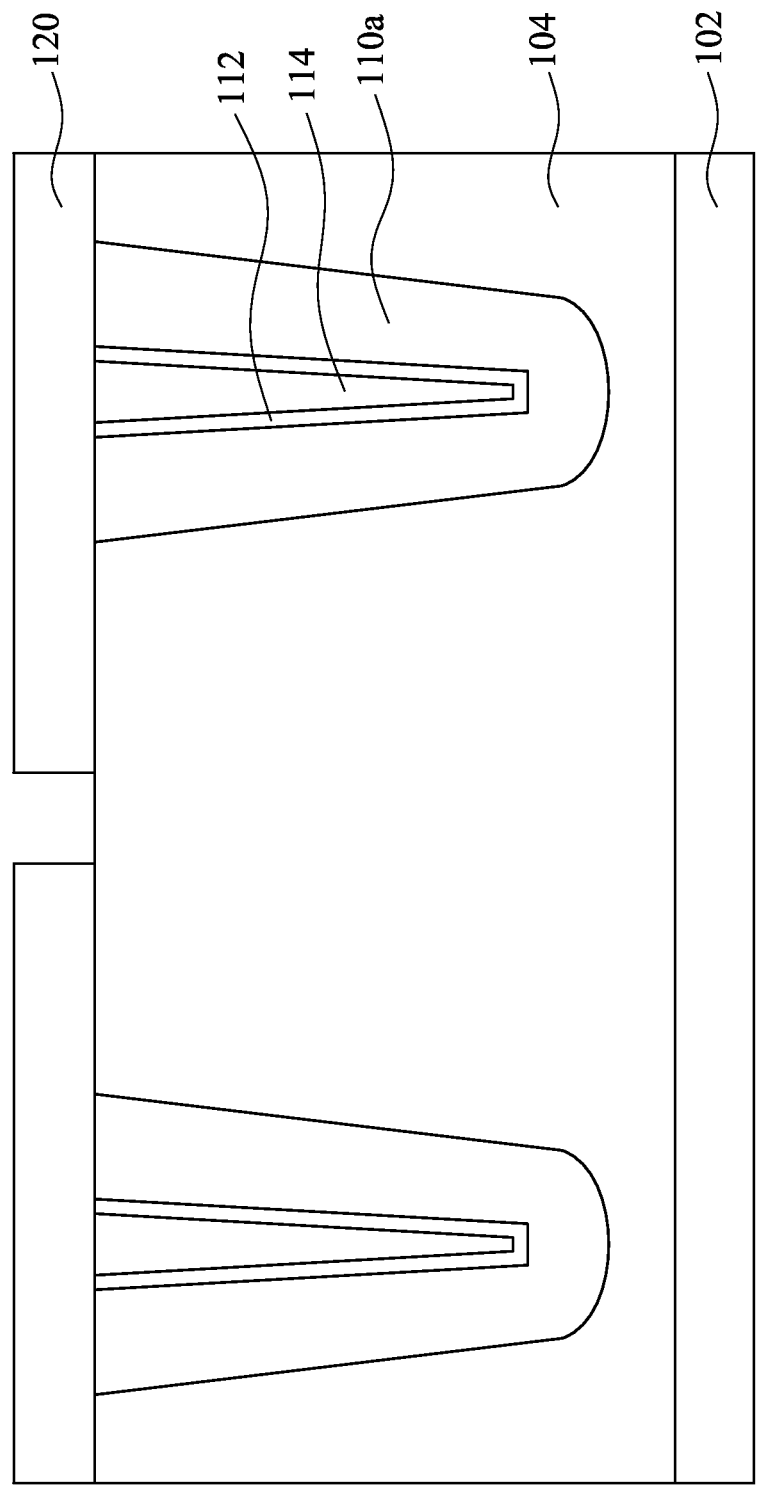
Figure 3I:
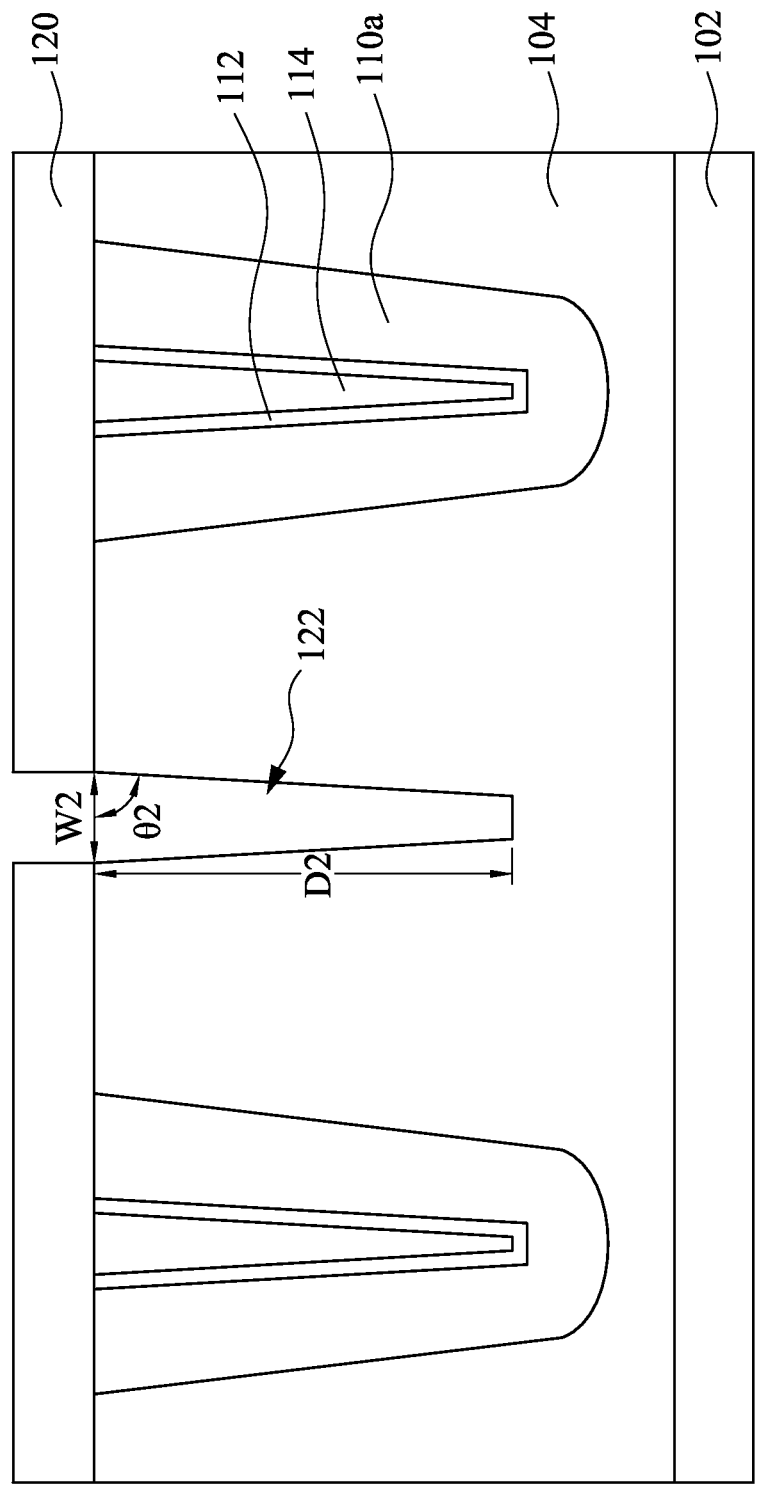
Figure 3J:
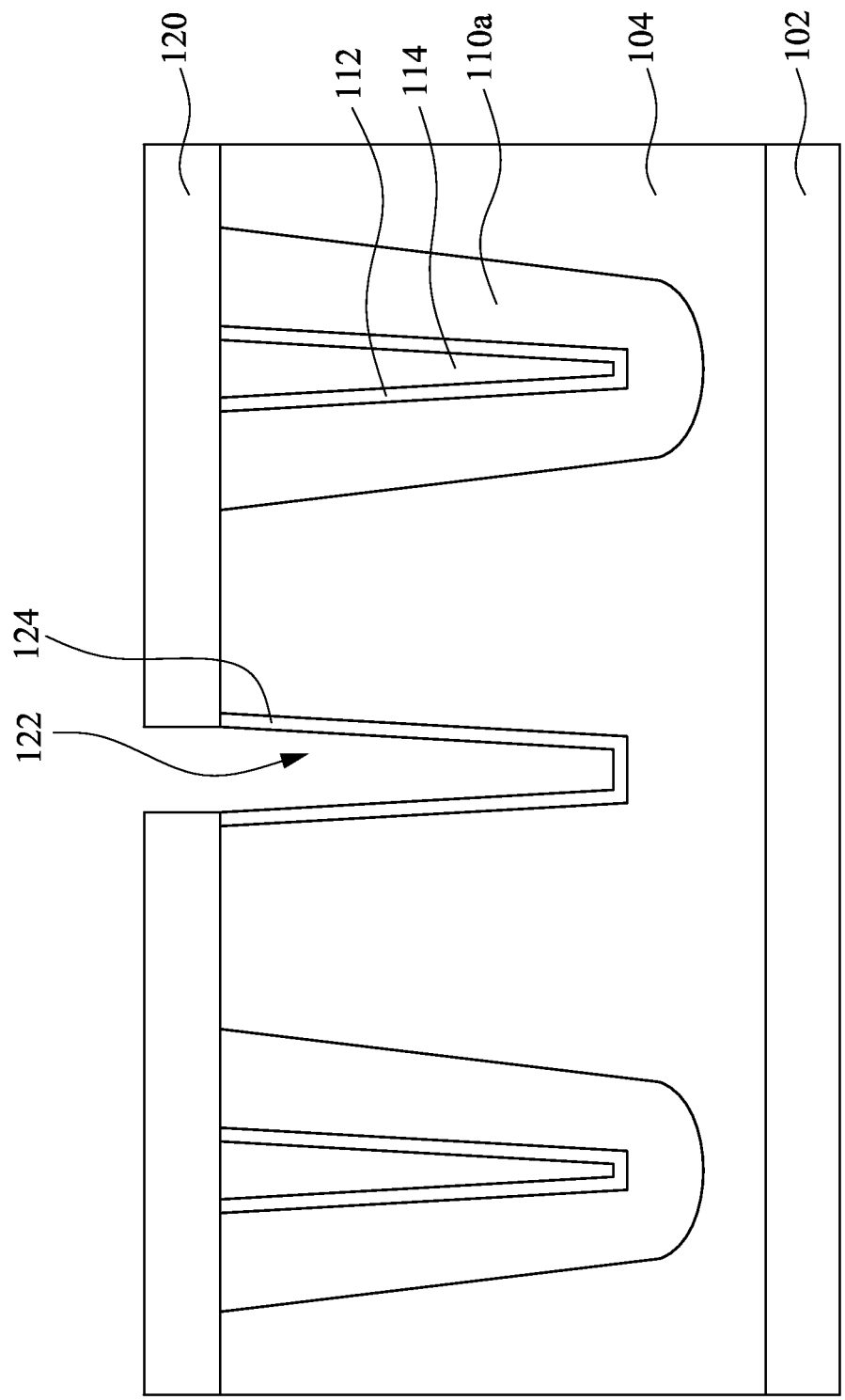
Figure 3K:
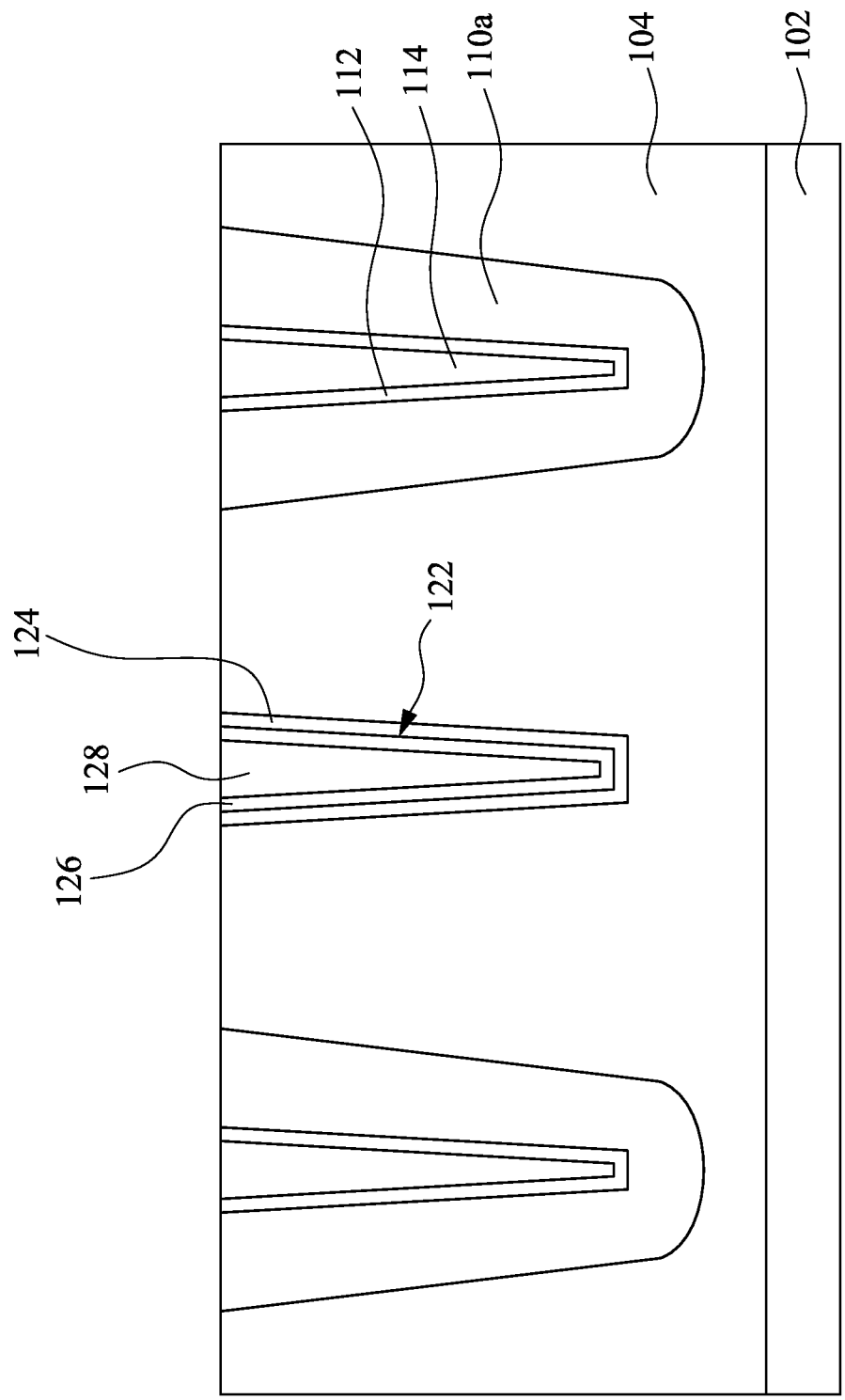
Figure 3L:
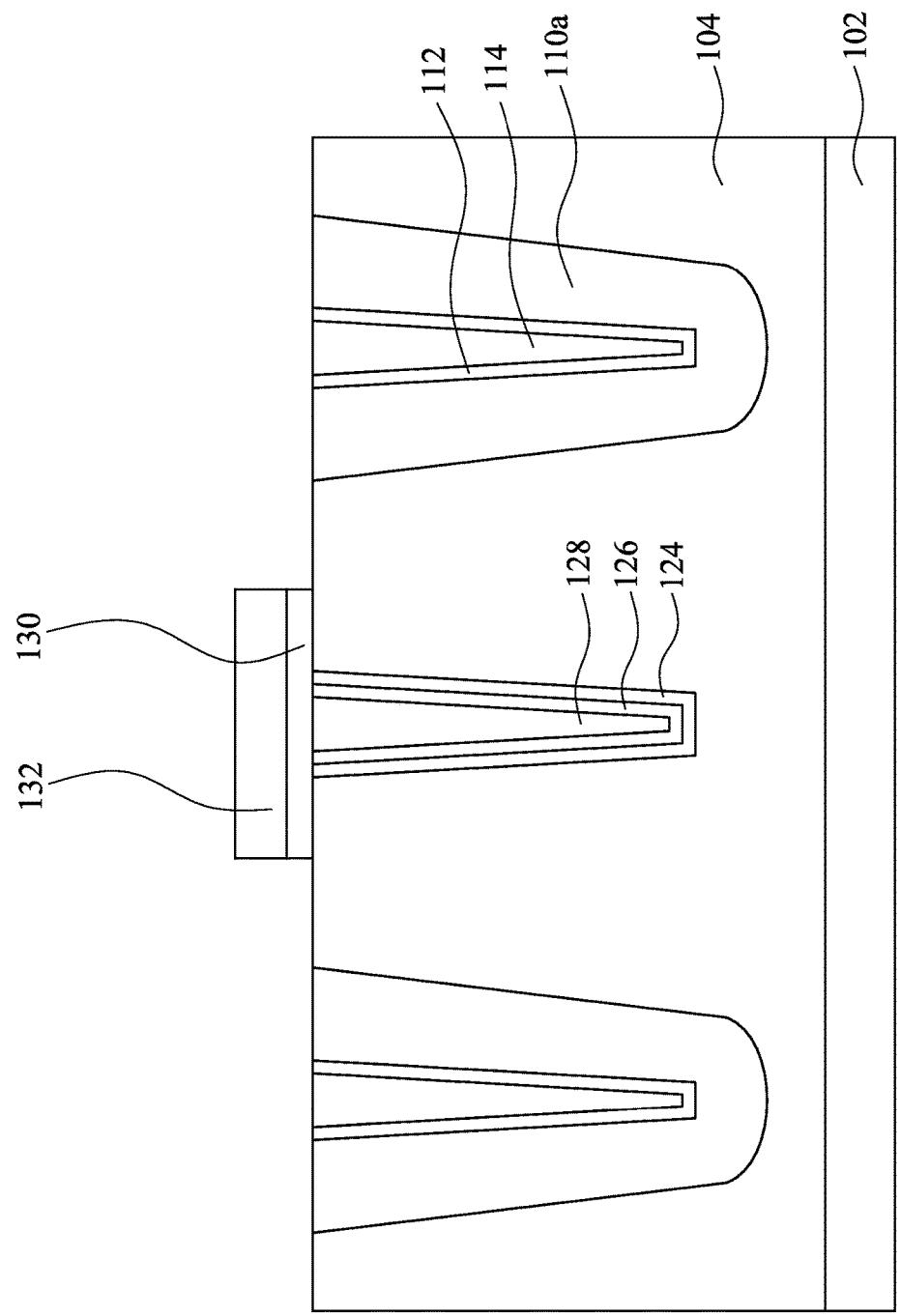
Figure 3M:
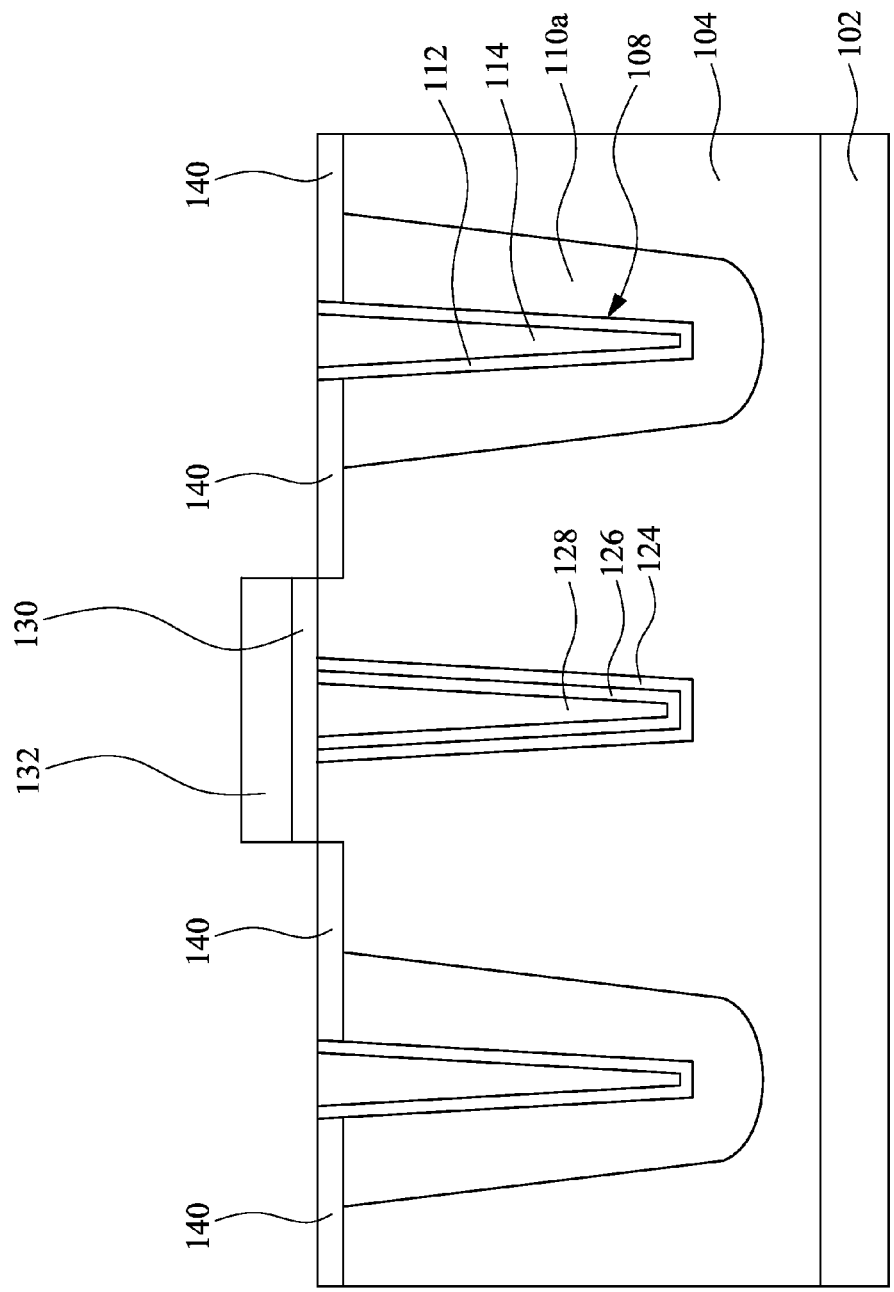
Figure 3N:
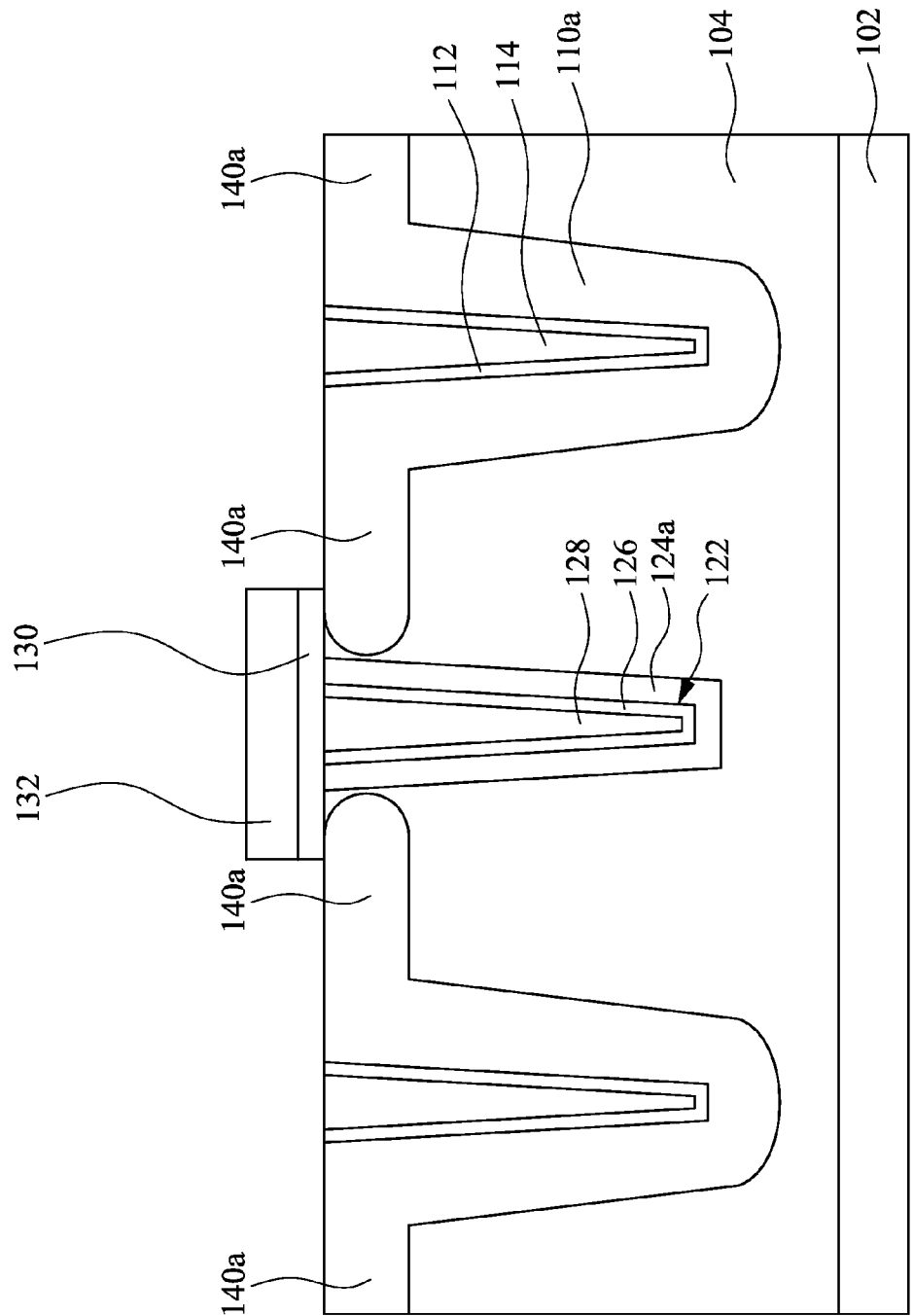
Figure 3O:
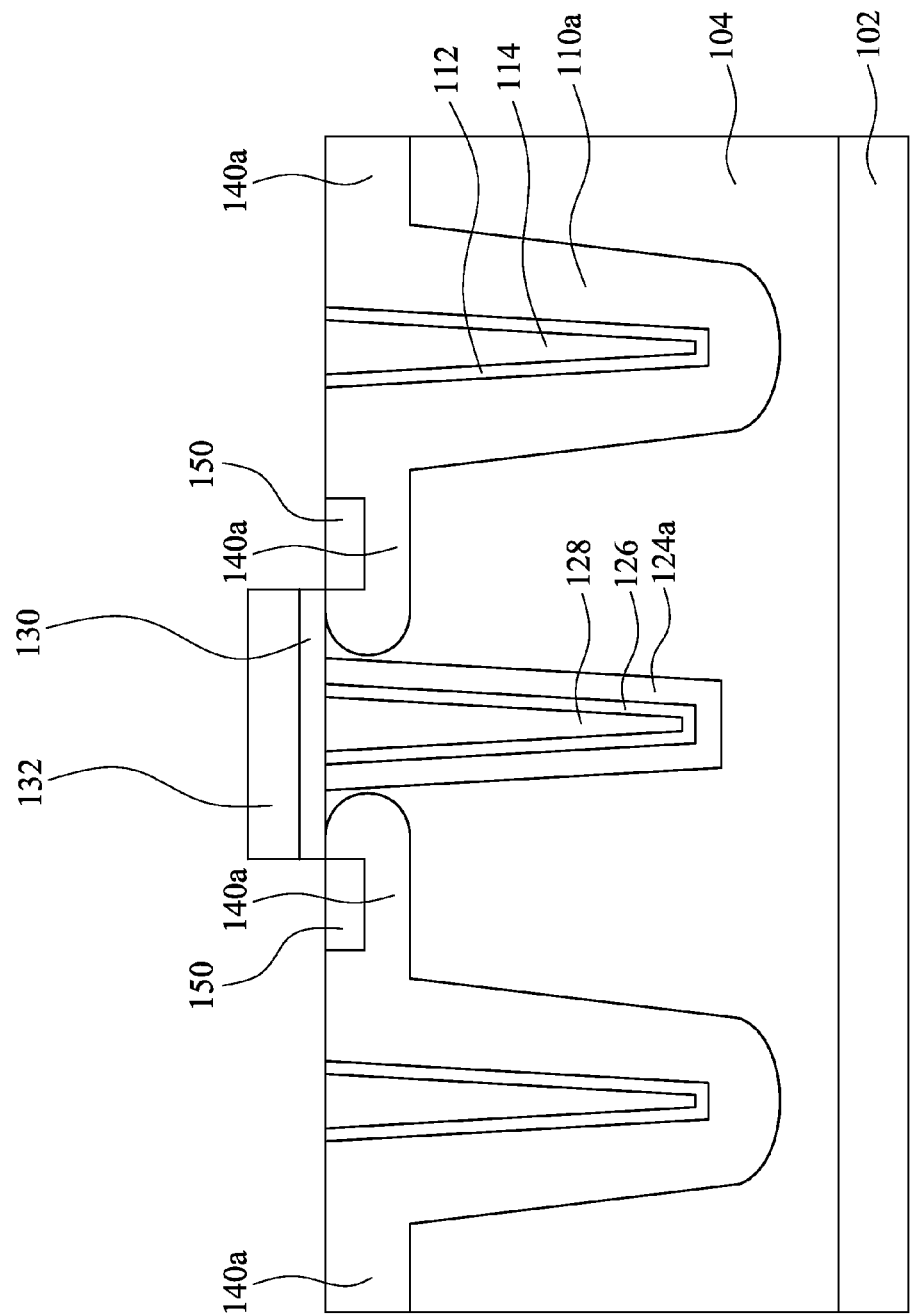
Figure 3P:
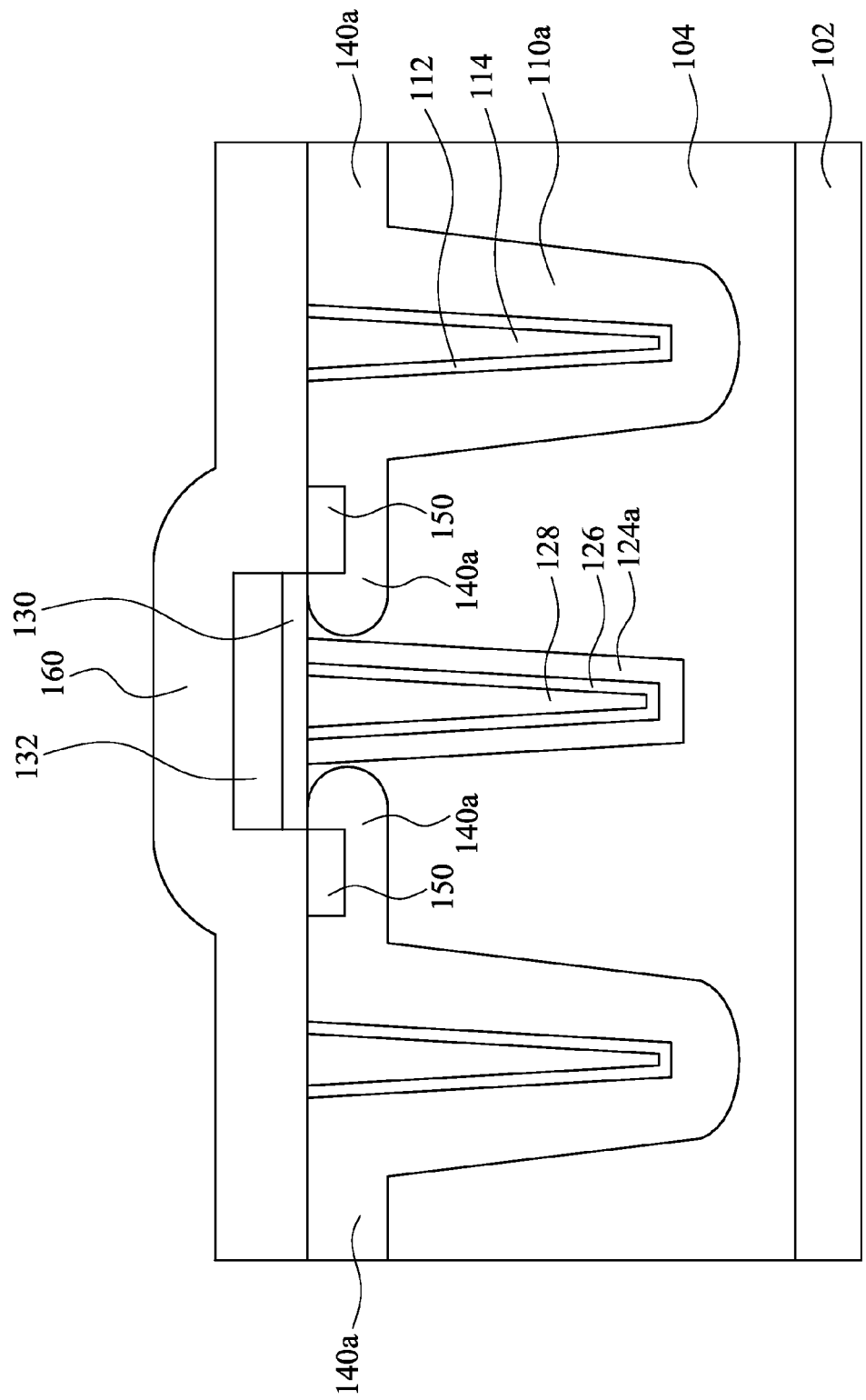
Figure 3Q:
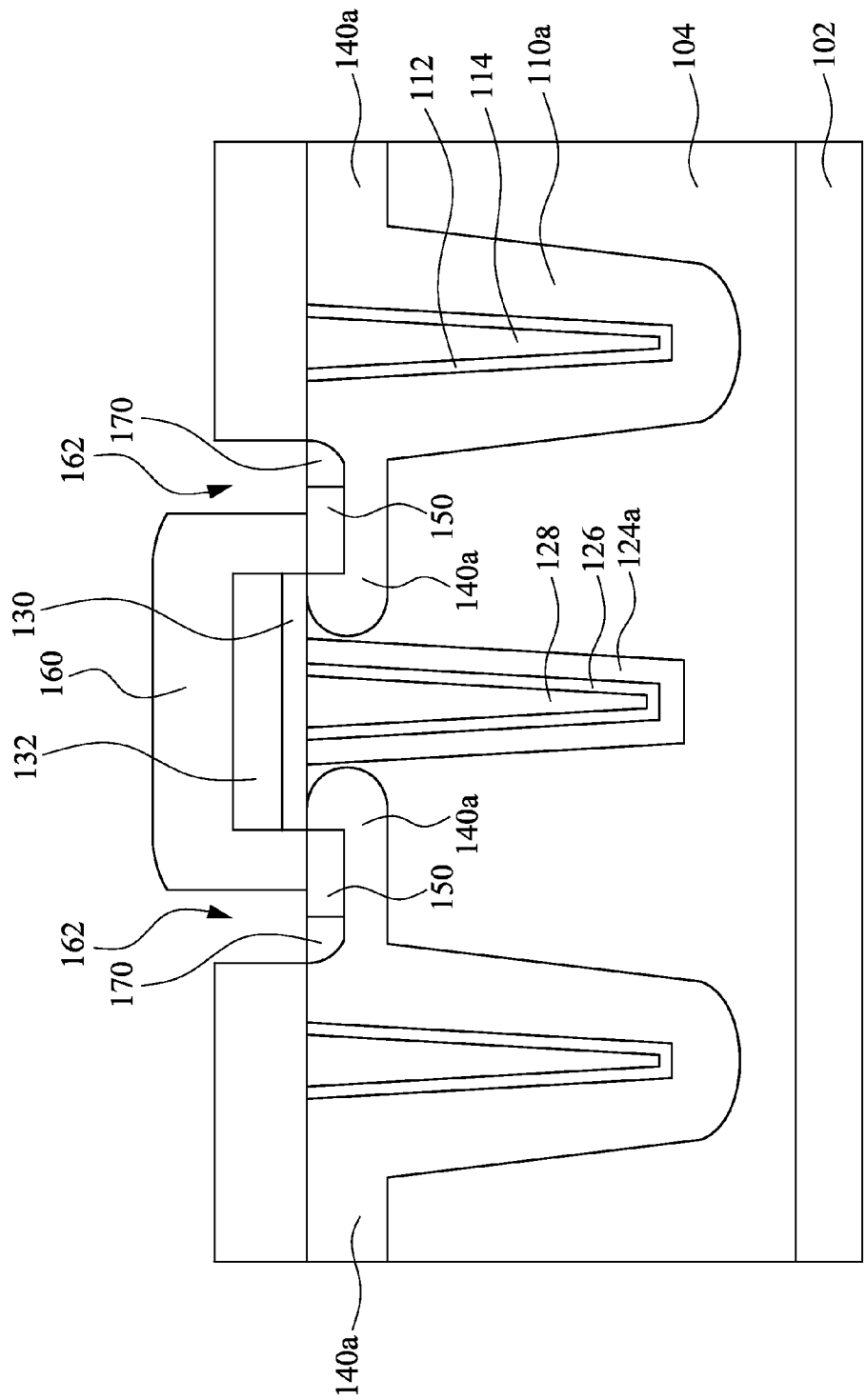

FIGS. 3A-3Q are cross-sectional views at various stages of fabricating a semiconductor device having a super junction structure in accordance with some embodiments.

As shown in FIG. 3A, a doped substrate 102 is provided, and an epitaxial layer 104 of a first conductivity type is then formed over the substrate 102. The epitaxial layer 104 is formed over the doped substrate 102 using an epitaxial process. In some embodiments, the epitaxial layer 104 is doped by introducing dopants during the formation of the epitaxial layer 104. In some embodiments, the epitaxial layer 104 is doped after formation of the epitaxial layer 104. In some embodiments, the epitaxial layer 104 is formed to have a thickness ranging from about 10 μm to about 80 μm. In some embodiments, the epitaxial layer 104 has a dopant concentration sufficient to result in a resistance ranging from about 0.1 ohm-cm to about 10 ohm-cm.

As shown in FIG. 3B, a hard mask layer 106 is formed over the epitaxial layer 104. In some embodiments, a hard mask material is formed by a chemical vapor deposition (CVD) process, a physical vapor deposition (PVD) process, spin-on coating, or another suitable formation process, and then patterned using a photolithography/etching process, a laser drilling process or another suitable material removal process to form the hard mask layer 106. In some embodiments, the hard mask layer 106 includes silicon dioxide, silicon nitride or another suitable masking material. In some embodiments, the hard mask layer 106 has a thickness ranging from about 5,000 Å to about 25,000 Å. The hard mask layer 106 exposes a portion of the epitaxial layer 104 for forming a first trench.

As shown in FIG. 3C, the exposed portion of the epitaxial layer 104 is removed according to the hard mask layer 106 to form the first trench 108 in the epitaxial layer 104. In some embodiments, the epitaxial layer 104 is removed by a dry etching process. In some embodiments, the etchant includes carbon fluorides ($C_xF_y$), sulfur hexafluoride ($SF_6$), oxygen gas ($O_2$), helium (He), carbon chlorides ($C_xCl_y$), argon (Ar) or another suitable etchant material. In some embodiments, the first trench is a straight walled trench or an angled trench. In the embodiment of FIG. 3C, the first trench 108 is an angled trench. In some embodiments, an angle θ1 between a sidewall of the angled first trench 108 and a top surface of the epitaxial layer 104 ranges from about 85-degrees to about 89-degrees. In some embodiments, an aspect ratio W1/D1 of the first trench 108 ranges from about 1.5/50 to about 5/50. In some embodiments, the depth D1 of the first trench 108 ranges from about 8 μm to about 50 μm.

As shown in FIG. 3D, ion implantation is performed to deposit dopants 110 of a second conductivity type into a sidewall of the first trench 108. In some embodiments, a vertical ion implantation process is performed on the angled first trench 108. In some embodiments, a tilt ion implantation process is performed on a straight walled first trench. In some embodiments, the ion implantation deposits p-type dopants 110 into the sidewall of the first trench 108. In some embodiments, the p-type dopants 110 includes boron, boron difluoride, or another suitable p-type dopant. In some embodiments, the dopants 110 has a dopant concentration ranges from about $10^{15}$ ions/cm$^3$ to about $10^{18}$ ions/cm$^3$.

After the dopants 110 are deposited, the hard mask layer 106 is removed. In some embodiments, the hard mask layer 106 is removed using an etching process, a planarization process, or another suitable material removal process.

As shown in FIG. 3E, an insulating layer 112 and a fill material 114 are formed in the first trench 108. In some embodiments, the insulating layer 112 is omitted. In some embodiments, the insulating layer 112 is formed prior to formation of the fill material 114. In some embodiments, the insulating layer 112 includes silicon dioxide, aerogel or another suitable insulating material. In some embodiments, the insulating layer 112 is blanket deposited using a CVD process, a PVD process, an atomic layer deposition (ALD) process, a spin-on process or another suitable formation process. In some embodiments, the fill material 114 includes a conductive material such as polysilicon or another suitable conductive material. In some embodiments, the fill material 114 includes a dielectric material, such as silicon dioxide, a silicon nitride or another suitable dielectric material. In some embodiments, the fill material 114 is an air gap. In some embodiments, the fill material 114 is formed using a CVD process, a PVD process, an ALD process, a spin-on coating process or another formation process.

As shown in FIG. 3F, a planarization process is performed. In some embodiments, the planarization process includes a chemical mechanical polishing (CMP) process, a grinding process, an etching process or another suitable material removal process. The planarization process removes portions of the fill material 114 and the insulating layer 112 outside the first trench 108. In some embodiments, after the planarization process, a top surface of the fill material 114 and a top surface of the insulating layer 112 are coplanar with a top surface of the epitaxial layer 104.

As shown in FIG. 3G, the dopants 110 are diffused into the epitaxial layer 104 to form a first doped region 110a of the second conductivity type in the epitaxial layer 104 and surrounding the first trench 108. In some embodiments, the dopants 110 are diffused using a thermal process. The thermal process causes the dopants 110 to diffuse from the original location at a sidewall surface of the first trench 108 farther into the epitaxial layer 104. In some embodiments, the thermal process includes heating at a temperature ranging from about 1000° C. to about 1250° C. In some embodiments, the thermal process has a duration ranging from about 30 minutes to about 300 minutes. In some embodiments, the thermal process is conducted in an inert environment. In some embodiments, the thermal process is conducted in an environment containing reducing agents.

As shown in FIG. 3H, another hard mask layer 120 is formed over the epitaxial layer 104. In some embodiments, a hard mask material is formed by a CVD process, a PVD process, spin-on coating, or another suitable formation process, and then patterned using a photolithography/etching process, a laser drilling process or another suitable material removal process to form the hard mask layer 120. In some embodiments, the hard mask layer 120 includes silicon dioxide, silicon nitride or another suitable masking material. In some embodiments, the hard mask layer 120 has a thickness ranging from about 5,000 Å to about 25,000 Å. The hard mask layer 120 exposes a portion of the epitaxial layer 104 for forming a second trench.

As shown in FIG. 3I, the exposed portion of the epitaxial layer 104 is removed according to the hard mask layer 120 to form the second trench 122 in the epitaxial layer 104 and separated from the first trench 108. In some embodiments, the epitaxial layer 104 is removed by a dry etching process. In some embodiments, the etchant includes carbon fluorides ($C_xF_y$), sulfur hexafluoride ($SF_6$), oxygen gas ($O_2$), helium (He), carbon chlorides ($C_xCl_y$), argon (Ar) or another suitable etchant material. In some embodiments, the second trench is a straight walled trench or an angled trench. In the embodiment of FIG. 3I, the second trench 122 is an angled trench. In some embodiments, an angle θ2 between a sidewall of the angled second trench 122 and a top surface of the epitaxial layer 104 ranges from about 85-degrees to about 89-degrees. In some embodiments, an aspect ratio W2/D2 of the second trench 122 ranges from about 1.5/50 to about 5/50. In some embodiments, the depth D2 of the second trench 122 ranges from about 8 μm to about 50 μm.

As shown in FIG. 3J, ion implantation is performed to deposit dopants 124 of the first conductivity type into a sidewall of the second trench 122. In some embodiments, a vertical ion implantation process is performed on the angled second trench 122. In some embodiments, a tilt ion implantation process is performed on a straight walled second trench. In some embodiments, the ion implantation deposits n-type dopants into the sidewall of the second trench 122. In some embodiments, the n-type dopants include phosphorus, arsenic, antimony, bismuth, selenium, or tellurium, or another suitable n-type dopant. In some embodiments, the dopants 124 has a dopant concentration ranges from about $10^{12}$ ions/cm$^3$ to about $10^{17}$ ions/cm$^3$.

As shown in FIG. 3K, the hard mask layer 120 is removed. Next, an insulating layer 126 is formed in the second trench 122, and a fill material 128 is then filled in the second trench 122. A planarization process is then performed on the fill material 128 and the insulating layer 126. In some embodiments, the hard mask layer 120 is removed using an etching process, a planarization process, or another suitable material removal process.

In some embodiments, the insulating layer 126 is formed prior to formation of the fill material 128. In some embodiments, the insulating layer 126 includes silicon dioxide, aerogel or another suitable insulating material. In some embodiments, the insulating layer 126 is blanket deposited using a CVD process, a PVD process, an ALD process, a spin-on process or another suitable formation process. In some embodiments, the fill material 128 includes a conductive material such as polysilicon or another suitable conductive material. In some embodiments, the fill material 128 includes a dielectric material, such as silicon dioxide, a silicon nitride or another suitable dielectric material. In some embodiments, the fill material 128 is an air gap. In some embodiments, the fill material 128 is formed using a CVD process, a PVD process, an ALD process, a spin-on coating process or another formation process.

In some embodiments, the planarization process includes a CMP process, a grinding process, an etching process or another suitable material removal process. The planarization process removes portions of the fill material 128 and the insulating layer 126 outside the second trench 122. In some embodiments, after the planarization process, a top surface of the fill material 128 and a top surface of the insulating layer 126 are coplanar with a top surface of the epitaxial layer 104.

As shown in FIG. 3L, a gate dielectric layer 130 and a gate electrode 132 are formed. In some embodiments, a gate dielectric material and a gate electrode material are sequentially blanket deposited and then patterned to form the gate dielectric layer 130 and the gate electrode 132. In some embodiments, the gate dielectric material is blanket deposited using a PVD process, a CVD process, a spin-on coating process, a thermal dry oxidation, a thermal wet oxidation or another formation process. In some embodiments, the gate electrode material is blanket deposited using a PVD process, a CVD process, an ALD process, a plating process, a spin-on coating process or another suitable formation process. In some embodiments, the gate electrode material and the gate dielectric material are patterned using a photolithography/etching process or another suitable material removal process.

As shown in FIG. 3M, ion implantation is performed to deposit dopants 140 of the second conductivity type into a top surface of the epitaxial layer 104 around the gate electrode 132, the fill material 114 and the insulating layer 112. In some embodiments, the ion implantation is combined with a masking process. In some embodiments, the masking process includes forming a patterned photoresist material or a patterned hard mask layer over the epitaxial layer 104. In some embodiments, the ion implantation deposits p-type dopants 140 into a top surface of the epitaxial layer 104. In some embodiments, the p-type dopants 140 include boron, boron difluoride, or another suitable p-type dopant. In some embodiments, the dopants 140 has a dopant concentration ranges from about $10^{15}$ ions/cm$^3$ to about $10^{18}$ ions/cm$^3$.

As shown in FIG. 3N, the dopants 140 are diffused into the epitaxial layer 104 to form a surface doped region 110a. In some embodiments, the dopants 140 are diffused using a thermal process. The thermal process causes the dopants 140 to diffuse from the original location farther into the epitaxial layer 104. In some embodiments, the thermal process includes heating at a temperature ranging from about 1000° C. to about 1250° C. In some embodiments, the thermal process has a duration ranging from about 30 minutes to about 200 minutes. In some embodiments, the thermal process is conducted in an inert environment. In some embodiments, the thermal process is conducted in an environment containing reducing agents. In some embodiments, the dopants 124 shown in FIG. 3M are also diffused during the thermal process, and thus to form a second doped region 124a in the epitaxial layer 104 and surrounding the second trench 122, as shown in FIG. 3N. The second doped region 124a has a dopant concentration greater than a dopant concentration of the epitaxial layer 104.

As shown in FIG. 3O, a source region 150 is formed. In some embodiments, the source region 150 of the first conductivity type is formed using an ion implantation process. In some embodiments, the ion implantation is combined with a masking process. In some embodiments, the masking process includes forming a patterned photoresist material or a patterned hard mask layer over the epitaxial layer 104. In some embodiments, the source region 150 has a dopant concentration ranging from about $10^{18}$ ions/cm$^3$ to about $10^{20}$ ions/cm$^3$. In some embodiments, the source region 150 includes n-type dopants. In some embodiments, the n-type dopants include phosphorus, arsenic, antimony, bismuth, selenium, or tellurium, or another suitable n-type dopant. In some embodiments, a thermal process is performed after the ion implantation process. In some embodiments, the thermal process includes heating at an environment having a temperature ranging from about 850° C. to about 1050° C. In some embodiments, a duration of the thermal process ranges from about 30 minutes to about 60 minutes. In some embodiments, the thermal process is performed in an inert environment. In some embodiments, the thermal process is performed in an environment including a reducing agent.

As shown in FIG. 3P, an ILD 160 is formed over the gate electrode 132. In some embodiments, the ILD 160 is formed using a CVD process, a PVD process, a spin-on process or another suitable formation process.

As shown in FIG. 3Q, the ILD 160 is patterned to form an opening 162, and a heavily doped region 170 of the second conductivity type is then formed beneath the opening 162 and adjacent to the source region 150. In some embodiments, the ILD 160 is patterned using a photolithography/etching process, a laser drilling process or another suitable material removal process. In some embodiments, the heavily doped region 170 is formed by an ion implantation process. In some embodiments, the heavily doped region 170 includes p-type dopants. In some embodiments, the p-type dopants include boron, boron difluoride or other suitable p-type dopants. In some embodiments, a dopant concentration of the heavily doped region 170 ranges from about $10^{17}$ ions/cm$^3$ to about $10^{20}$ ions/cm$^3$. In some embodiments, the dopant concentration of the heavily doped region 170 is greater than that of the surface doped region 140*a* or the first doped region 110*a*.

After the formation of the heavily doped region 170, a conductive layer 180 is formed in the opening 162 and over the ILD 160, as shown in FIG. 1. The conductive layer 180 electrically connects to the source region 150. In some embodiments, a conductive material is blanket deposited by a PVD process, a sputtering process, an ALD process, a plating process, or another suitable formation process, and then patterned by a photolithography/etching process or another suitable material removal process to form the conductive layer 180.

According to some embodiments, a semiconductor device having a super junction structure includes a substrate, an epitaxial layer of a first conductivity type, a first trench, a first doped region of a second conductivity type opposite to the first conductivity type, a second trench and a second doped region of the first conductivity type. The epitaxial layer of the first conductivity type is over the substrate. The first trench is in the epitaxial layer. The first doped region of the second conductivity type is in the epitaxial layer and surrounds the first trench. The second trench is in the epitaxial layer and separated from the first trench. The second doped region of the first conductivity type is in the epitaxial layer and surrounds the second trench. The second doped region has a dopant concentration greater than a dopant concentration of the epitaxial layer.

According to some embodiments, a semiconductor device having a super junction structure includes a substrate, an epitaxial layer of a first conductivity type, a first doped region of a second conductivity type opposite to the first conductivity type, a second trench and a second doped region of the first conductivity type. The epitaxial layer of the first conductivity type is over the substrate. The first doped region of the second conductivity type is in the epitaxial layer. The second trench is in the epitaxial layer and separated from the first doped region. The second doped region of the first conductivity type is in the epitaxial layer and surrounds the second trench. The second doped region has a dopant concentration greater than a dopant concentration of the epitaxial layer.

According to some embodiments, a method for manufacturing a semiconductor device having a super junction structure includes: forming an epitaxial layer over a substrate, in which the epitaxial layer is of a first conductivity type; forming a first trench in the epitaxial layer; forming a first doped region in the epitaxial layer and surrounding the first trench, in which the first doped region is of a second conductivity type opposite to the first conductivity type; forming a second trench in the epitaxial layer and separated from the first trench; and forming a second doped region in the epitaxial layer and surrounding the second trench, in which the second doped region is of the first conductivity type and has a dopant concentration greater than a dopant concentration of the epitaxial layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device having a super junction structure, comprising:
   a substrate;
   an epitaxial layer of a first conductivity type over the substrate;
   a first trench in the epitaxial layer;
   a first doped region of a second conductivity type opposite to the first conductivity type in the epitaxial layer, the first doped region surrounding the first trench and in contact with a sidewall of the first trench;
   a second trench in the epitaxial layer and separated from the first trench and not in contact with the substrate; and
   a second doped region of the first conductivity type in the epitaxial layer and not in contact with the substrate, the second doped region surrounding the second trench and in contact with a sidewall of the second trench, wherein the second doped region has a dopant concentration greater than a dopant concentration of the epitaxial layer, and the second doped region has a second depth less than a first depth of the first doped region, and the epitaxial layer is laterally between the first doped region and the second doped region.

2. The semiconductor device of claim 1, wherein the dopant concentration of the second doped region is in a range of about $10^{12}$ ions/cm$^3$ to about $10^{17}$ ions/cm$^3$.

3. The semiconductor device of claim 1, wherein the second trench is an angled trench.

4. The semiconductor device of claim 1, further comprising a fill material in the second trench.

5. The semiconductor device of claim 4, further comprising an insulating material between the fill material and the second doped region.

6. The semiconductor device of claim 1, wherein the substrate is of the first conductivity type and has a dopant concentration greater than the dopant concentration of the second doped region.

7. The semiconductor device of claim 1, further comprising a gate electrode over the epitaxial layer and substantially aligned with the second trench.

8. The semiconductor device of claim 7, wherein the gate electrode has a width greater than a width of the second trench.

9. The semiconductor device of claim 1, further comprising a source region of the first conductivity type in the epitaxial layer and between the first trench and the second doped region.

10. The semiconductor device of claim 9, wherein a dopant concentration of the source region is greater than the dopant concentration of the second doped region.

11. The semiconductor device of claim 9, further comprising a surface doped region of the second conductivity type in the epitaxial layer and between the source region and the second doped region.

12. The semiconductor device of claim 11, wherein the surface doped region is continuous with the first doped region.

13. The semiconductor device of claim 1, further comprising:
   a gate electrode over the epitaxial layer and substantially aligned with the second trench;
   a gate dielectric layer between the gate electrode and the epitaxial layer; and
   a source region of the first conductivity type in the epitaxial layer and between the first trench and the second doped region.

14. The semiconductor device of claim 13, further comprising a conductive layer over the gate electrode and configured to electrically connect to the source region.

15. The semiconductor device of claim 14, further comprising an inter-layer dielectric (ILD) covering the gate electrode and between the gate electrode and the conductive layer.

16. The semiconductor device of claim 1, further comprising a fill material in the first trench.

17. The semiconductor device of claim 16, further comprising an insulating material between the fill material and the first doped region.

18. The semiconductor device of claim 11, wherein the surface doped region is not in contact with the second doped region.

19. The semiconductor device of claim 1, wherein the second doped region is separated from the first doped region.

* * * * *